(12) United States Patent
Yamaguchi

(10) Patent No.: US 8,780,980 B2
(45) Date of Patent: Jul. 15, 2014

(54) VIDEO IMAGE ENCODING DEVICE

(75) Inventor: Muneaki Yamaguchi, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 49 days.

(21) Appl. No.: 13/486,422

(22) Filed: Jun. 1, 2012

(65) Prior Publication Data

US 2013/0142252 A1 Jun. 6, 2013

Related U.S. Application Data

(63) Continuation-in-part of application No. PCT/JP2010/006008, filed on Oct. 7, 2010.

(30) Foreign Application Priority Data

Dec. 4, 2009 (JP) ................................. 2009-276260

(51) Int. Cl.
    *H04N 7/12* (2006.01)
    *H04N 11/02* (2006.01)
    *H04N 11/04* (2006.01)
    *H04N 7/26* (2006.01)
    *H03M 7/42* (2006.01)

(52) U.S. Cl.
    CPC ... *H04N 19/00951* (2013.01); *H04N 19/00218* (2013.01); *H04N 19/00121* (2013.01); *H04N 19/00278* (2013.01); *H03M 7/42* (2013.01)
    USPC .................................................. 375/240.03

(58) Field of Classification Search
    None
    See application file for complete search history.

(56) References Cited

U.S. PATENT DOCUMENTS

| | | | |
|---|---|---|---|
| 2007/0297501 A1* | 12/2007 | Hussain et al. | 375/240 |
| 2008/0212683 A1* | 9/2008 | Nakata et al. | 375/240.23 |
| 2009/0073006 A1* | 3/2009 | Wegener | 341/61 |
| 2010/0150242 A1 | 6/2010 | Ozawa | |

FOREIGN PATENT DOCUMENTS

| | | |
|---|---|---|
| JP | 2008124926 | 5/2008 |
| WO | 2008129855 | 10/2008 |

OTHER PUBLICATIONS

The International Search Report and Written Opinion.
H264/AVC Textbook (revised 3rd edition) Sakae Okubo, Shin'Ya Kakuno, Toshihiro Kikuchi, Teruhiko Suzuki, pp. 86, 101, 148-150, 326, 328, 339-340.

* cited by examiner

*Primary Examiner* — Chieh M Fan
*Assistant Examiner* — Wednel Cadeau
(74) *Attorney, Agent, or Firm* — Bacon & Thomas, PLLC

(57) ABSTRACT

In a variable length encoding for video data, the compression rate of video image encoding is increased by improving the level encoding method. A CAVLC encoding unit acquires coefficients obtained by orthogonally transforming and quantizing video image data in each block unit, determines an encoding mode of variable length encoding among those in a table_A and a table_B, or a mixture thereof by a level encoding mode controller and outputs the determination result to a level_prefix unit. In the table_B, a fixed_length bit string is allocated to a level_prefix which is at least a prescribed value. The level_prefix unit performs a level_prefix encoding in the determined encoding mode to output the result to an output control unit.

8 Claims, 12 Drawing Sheets

TABLE_B 42

| LEVEL_PREFIX | BIT STRING |
|---|---|
| 0 | 01 |
| 1 | 001 |
| 2 | 0001 |
| 3 | 0000 1 |
| 4 | 1 0000 |
| 5 | 1 0001 |
| 6 | 1 0010 |
| 7 | 1 0011 |
| 8 | 1 0100 |
| 9 | 1 0101 |
| 10 | 1 0110 |
| 11 | 1 0111 |
| 12 | 1 1000 |
| 13 | 1 1001 |
| 14 | 1 1010 |
| 15 | 1 1011 |
| ... | ... |

| ENTROPY_CODING_MODE_FLAG | VARIABLE LENGTH ENCODING METHOD |
|---|---|
| 00 | CAVLC |
| 01 | CABAC |
| 10 | CAVLC BASED ON PRESENT INVENTION |
| 11 | RESERVED |

FIG. 8

TABLE_A 41

| LEVEL_PREFIX | BIT STRING |
|---|---|
| 0 | 1 |
| 1 | 01 |
| 2 | 001 |
| 3 | 0001 |
| 4 | 0000 1 |
| 5 | 0000 01 |
| 6 | 0000 001 |
| 7 | 0000 0001 |
| 8 | 0000 0000 1 |
| 9 | 0000 0000 01 |
| 10 | 0000 0000 001 |
| 11 | 0000 0000 0001 |
| 12 | 0000 0000 0000 1 |
| 13 | 0000 0000 0000 01 |
| 14 | 0000 0000 0000 001 |
| 15 | 0000 0000 0000 0001 |
| ... | |

FIG.9

TABLE_B 42

| LEVEL_PREFIX | BIT STRING |
|---|---|
| 0 | 01 |
| 1 | 001 |
| 2 | 0001 |
| 3 | 0000 1 |
| 4 | 1 0000 |
| 5 | 1 0001 |
| 6 | 1 0010 |
| 7 | 1 0011 |
| 8 | 1 0100 |
| 9 | 1 0101 |
| 10 | 1 0110 |
| 11 | 1 0111 |
| 12 | 1 1000 |
| 13 | 1 1001 |
| 14 | 1 1010 |
| 15 | 1 1011 |
| ... | ... |

| LEVEL_CODE_OFFSET_IDX | LEVEL_CODE_OFFSET |
|---|---|
| 1 | 4 |
| 010 | 5 |
| 011 | 6 |
| ... | ... |

VIDEO IMAGE ENCODING DEVICE

This application is a Continuation-in-Part Application of PCT International Application No. PCT/JP2010/006008 filed on 7 Oct. 2010, which designated the United States.

FIELD OF THE INVENTION

The present invention relates to an encoding device for encoding image data or the like and, more particularly, to an encoding device that increases compression efficiency in a variable length encoding.

BACKGROUND OF THE INVENTION

Recently, in a video encoding technique, a video encoding device having functions, such as intra-picture prediction, inter-picture prediction, orthogonal transformation, quantization and variable length encoding, a representative of which is an MPEG (Moving Picture Experts Group), has been developed and put into practical application.

In the above-described functions, the variable length encoding varies a length of code to be assigned to video data and assigns a code of shorter length to data appearing most frequently, the amount of the video data having been reduced by the previous inter-picture prediction, the intra-picture prediction, the orthogonal transformation and the quantization, thereby improving the compression efficiency (see, e.g., Non-Patent Document 1).

In MPEG-4 part 10/H.264 (hereinafter referred to as "H.264") (see Non-Patent Document 1), which is one of the video encoding methods, two types of variable length encoding, i.e., CAVLC (Context Adaptive Variable Length Coding) and CABAC (Context Adaptive Binary Arithmetic Coding) can be selected.

CABAC is a variable length encoding method having a high compression efficiency, and is widely employed to applications which require a high compression rate. Meanwhile, CAVLC has a compression efficiency lower than that of CABAC, but a computational cost thereof is lower than that of CABAC when encoding or decoding is performed. For this reason, H.264 Baseline Profile which is centered on the application of mobile devices allows only CAVLC to be used (see Non-Patent Document 1).

The throughput of the variable length encoding increases in proportion to the bit rate. Accordingly, at high bit rate, it is difficult to apply CABAC which has a high computational cost compared to CAVLC. For this reason, CAVLC is increasingly applied to video encoding applications which require a high bit rate (e.g., 100 Mbps or higher).

Non-Patent Document 1: Joint Video Team (JVT) of ISO/IEC MPEG & ITU-T VCEG: Text of ISO/IEC 14496-10 Advanced Video Coding 3rd Edition (2004)

However, when CAVLC is applied at high bit rate due to the computational cost or the like, the following problems may be caused.

A bit stream, which is video data generated by an H.264 encoding device, includes a variety of types of header information having encoding parameters and encoding mode information, motion vector information used in inter-picture prediction, and information (hereinafter referred to as "quantized transform coefficients") obtained by performing transformation and quantization on the prediction error, which is differential between pixels of a target picture after inter- and intra-picture prediction have been performed. The variety of types of header information is constant regardless of the bit rate. The bit rate also rarely influences motion vector information, even though it does cause a slight difference.

Further, description is made on the quantized transform coefficients as bellow. In general, a bit rate is controlled by varying a quantization step. When the quantization step increases, values of quantized transform coefficients (levels) after quantization are decreased or the levels have many zeros. In the variable length encoding, levels, which have many zeros or are low, are assigned with codes so that compression efficiency increases. Accordingly, as the bit rate increases, the amount of code bits generated from the quantized transform coefficients increases, and thus, encoding efficiency decreases.

As described above, at a high bit rate, a problem arises in that the values of levels (quantized transform coefficients) increase and thus encoding efficiency decreases.

SUMMARY OF THE INVENTION

In view of the above, the present invention improves a compression rate in video encoding by particularly improving an encoding method of levels when variable length encoding is performed on image data.

In accordance with an aspect of the present invention, there is provided a video image encoding device including: a variable length encoding unit for performing variable length encoding on quantized transform coefficients which have been subjected to orthogonal transformation and quantization with respect to video image data on a region basis. The variable length encoding unit has a plurality of encoding modes for performing the variable length encoding on the quantized transform coefficients and performs the variable length encoding by using one of the encoding modes. The encoding modes include CAVLC (Context Adaptive Variable Length Coding), which includes performing fixed length encoding on each level_prefix of the quantized transform coefficients which is equal to or greater than a threshold value, such that each level prefix is distinguishable.

Further, the CAVLC may include encoding level prefixes of the quantized transform coefficients into variable length and fixed length and level suffixes thereof into variable length codes by using a table, a part of the level prefixes and the rest thereof being encoded into the variable length codes and the fixed length codes respectively, and each of the variable length codes of the level prefixes may have a bit string formed by placing, in front of '1', one or more '0's the number of which is obtained by adding 1 to a value of the corresponding level_prefix, and each of the fixed length codes of the level prefixes may have a bit string of which foremost bit is '1' is formed.

Further, the variable length encoding unit preferably stores said one of the encoding modes used in the variable length encoding in a PPS (Picture Parameter Set) or macroblock data.

Further, the fixed length encoding may be performed on each level_prefix of the quantized transform coefficients which is equal to or greater than the threshold value such that each level prefix is distinguishable, if a CBP (Coded Block Pattern) is not zero or a prediction mode is an Intra 16×16 mode and an entropy_coding_mode_flag in the PPS has a specific value.

In accordance with another aspect of the present invention, there is provided a video image encoding method including variable length encoding of performing variable length encoding on quantized transform coefficients which have been subjected to orthogonal transformation and quantization with respect to video image data on a region basis. Said variable length encoding executes a plurality of encoding modes for performing the variable length encoding on the quantized transform coefficients and performs the variable length encoding by using one of the encoding modes, and the encoding modes includes CAVLC(Context Adaptive Variable Length Coding), which includes performing fixed length encoding on each level_prefix of the quantized transform coefficients which is equal to or greater than a threshold value, such that each level prefix is distinguishable. In accordance with the present invention, when video image data is encoded, levels higher than a predetermined threshold value are encoded using fixed length, and therefore the compression rate can be increased by reducing the amount of code bits.

BRIEF DESCRIPTION OF THE DRAWINGS

FIG. 8 is a diagram showing an example of table_A in accordance with the embodiment of the present invention.

FIG. 9 is a diagram showing an example of table_B in accordance with the embodiment of the present invention.

DETAILED DESCRIPTION OF THE EMBODIMENTS

Embodiments of the present invention will be described in detail below with reference to the drawings.

Figure 1:
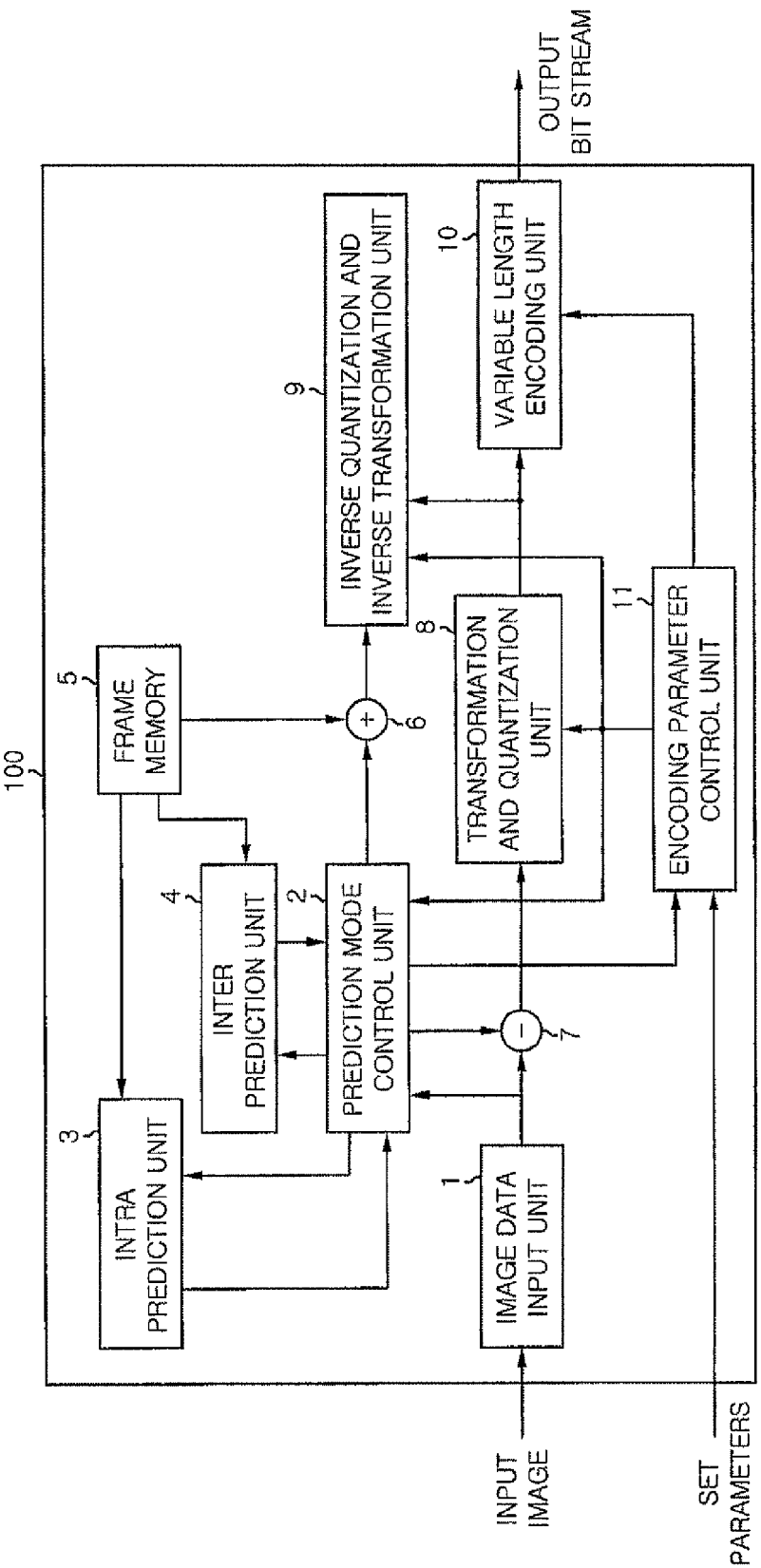
FIG. 1 is a functional block diagram of a video image encoding device in accordance with an embodiment of the present invention.

FIG. 1 is a functional block diagram showing an example of the overall configuration of a video encoding device 100 in accordance with an embodiment of the present invention. As shown in FIG. 1, the video encoding device 100 includes an image data input unit 1, a prediction mode control unit 2, an intra prediction unit 3, an inter prediction unit 4, a frame memory 5, an adder 6, a subtracter 7, a transformation and quantization unit 8, an inverse quantization and inverse transformation unit 9, a variable length encoding unit 10 and an encoding parameter control unit 11.

The image data input unit 1 receives video image data in a form of a plurality of macroblocks divided by an external signal processing device (not shown) such as an image block dividing unit and outputs the corresponding inputted video image data to the prediction mode control unit 2 and the subtracter 7.

Here, the (plurality of) macroblocks of video image data inputted to the image data input unit 1 refers to small areas which have been obtained by dividing each frame forming video image data in 16×16 pixel units. This macroblock is applied to encoding processing of video image data in an H.264/AVC video encoding standard which has been adopted by a joint project involving ISO/MPEG and ITU-T/VCEG.

ISO/MPEG stands for International Organization for Standardization/Moving Picture Experts Group. Further, ITU-T/VCEG stands for International Telecommunication Union-Telecommunication standardization sector/Video Coding Experts Group.

The intra prediction unit 3 receives the video image data from the prediction mode control unit 2, makes a prediction within a picture (intra prediction) using reference image data which is adjacent to the video image data and has been encoded and stored into the frame memory 5 and then determines the intra prediction mode. The intra prediction unit 3 outputs a predicted image and a prediction mode based on the determined intra prediction mode to the prediction mode control unit 2.

The inter prediction unit 4 receives the video image data from the prediction mode control unit 2, performs a prediction between pictures (inter prediction) by using reference image data of a frame adjacent in time to a frame including the video image data, the reference image data having been encoded and stored into the frame memory 5, and determines an inter prediction mode. The inter prediction unit 4 outputs parameters, such as a predicted image, a motion vector and the like, and a prediction mode based on the determined inter prediction mode to the prediction mode control unit 2.

The prediction mode control unit 2 outputs the video image data, acquired from the image data input unit 1, to the intra prediction unit 3 and the inter prediction unit 4. Further, the prediction mode control unit 2 receives, from the intra prediction unit 3 and the inter prediction unit 4, the results (predicted image and prediction mode) from the intra prediction performed by the intra prediction unit 3 and those from the inter prediction performed by the inter prediction unit 4, determines a prediction method expected to reduce the amount of code bits and outputs a predicted image, which is obtained by the determined prediction method, to the subtracter 7 and the prediction method and corresponding prediction parameters to the encoding parameter control unit 11.

The subtracter 7 receives video image data (divided into a plurality of macroblocks) outputted from the image data input unit 1 and the predicted image data outputted from the prediction mode control unit 2. The subtracter 7 performs subtraction of the predicted image data from the video image data and outputs a differential, i.e., differential image data which is acquired by said subtraction to the transformation and quantization unit 8.

The transformation and quantization unit 8 receives the differential image data from the subtracter 7 and performs an orthogonal transformation (i.e., transforms image data from space coordinates to frequency coordinates) on the differential image data for each image block (e.g., for each macroblock). Further, the transformation and quantization unit 8 quantizes the differential image data (transform coefficients) (i.e., classifying sample values having continuous values in a specific amplitude range into specific amplitude sections and presenting all values within each amplitude section by a single value within the amplitude section), the differential image data being obtained by performing the orthogonal transformation. The data obtained after the corresponding transformation and quantization (i.e., quantized transform coefficients) are outputted from the transformation and quantization unit 8 to the inverse quantization and inverse transformation unit 9 and the variable length encoding unit 10.

The inverse quantization and inverse transformation unit 9 receives the quantized transform coefficients from the transformation and quantization unit 8 and inversely quantizes and inversely transforms the quantized transform coefficients, thereby acquiring approximate values (approximate differential image data) of the original image data (differential image data before inputting to the transformation and quantization unit 8). The approximate differential image data on which inverse orthogonal transformation has been performed are outputted from the inverse quantization and inverse transformation unit 9 to the adder 6.

The approximate differential image data outputted from the inverse quantization and inverse transformation unit 9 and the predicted image data outputted from the prediction mode control unit 2 are inputted to the adder 6. In the adder 6, image data to be used by the intra prediction unit and the inter prediction unit 4 as the above-described reference image data are generated by adding the predicted image data to the approximate differential image data. The corresponding image data are outputted from the adder 6 to the frame memory 5.

The frame memory 5 stores the image data outputted from the adder 6. The image data are used as reference image data when the intra prediction unit 3 and the inter prediction unit 4 generates image data, i.e., predicted image data by predicting movement of each pixel from previously encoded video image data adjacent to the video image data and a frame which is adjacent in time to a current frame including the video image data. The frame memory 5 outputs the stored reference image data to the intra prediction unit 3 and the inter prediction unit 4 in response to a data read request therefrom.

The encoding parameter control unit 11 acquires parameters set by a user or the like when encoding is performed, and the prediction mode and the corresponding prediction parameters generated by the prediction mode control unit 2 and outputs predetermined encoding parameters to the prediction mode control unit 2, the transformation and quantization unit 8, the inverse quantization and inverse transformation unit 9, and the variable length encoding unit 10.

The variable length encoding unit 10 receives the quantized transform coefficients outputted from the transformation and quantization unit 8, and the encoding parameters outputted from the encoding parameter control unit 11. The variable length encoding unit 10 performs the variable length encoding on the quantized image data (quantized transform coefficients) and the encoding parameters, thereby generating a bit stream including the image data and the encoding parameters. Further, the variable length encoding unit 10 outputs the corresponding bit stream to an external device (not shown) connected to the video image encoding device 100.

Figure 2:
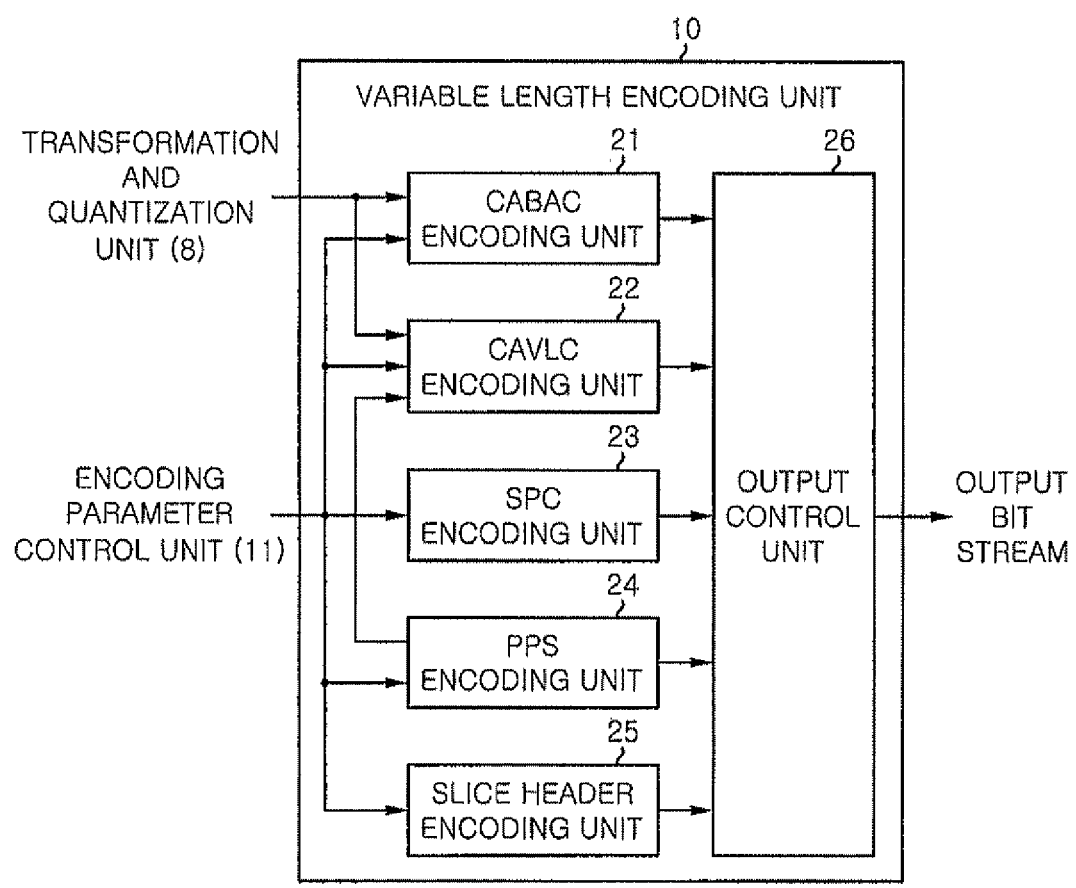
FIG. 2 is a functional block diagram of a variable length encoding unit in accordance with the embodiment of the present invention.

FIG. 2 is a diagram showing details of the variable length encoding unit 10 shown in FIG. 1. As shown in FIG. 2, the variable length encoding unit 10 includes a CABAC encoding unit 21, a CAVLC encoding unit 22, an SPS encoding unit 23, a PPS encoding unit 24, a slice header encoding unit 25 and an output control unit 26.

The CABAC encoding unit 21 receives the transformation and quantization coefficients from the transformation and quantization unit 8 and the encoding parameters from the encoding parameter control unit 11 to perform the variable length encoding in a sequence according to the H.264 standard (see Non-Patent Document 1). Encoding data acquired after performing the variable length encoding are outputted to the output control unit 26.

The CAVLC encoding unit 22 receives the quantized transform coefficients from the transformation and quantization unit 8, the encoding parameters from the encoding parameter control unit 11, and an "entropy_coding_mode_flag" from the PPS encoding unit 24, to perform the variable length encoding, which will be described in detail later. Encoding data acquired after performing the variable length encoding are outputted to the output control unit 26.

The SPS encoding unit 23 receives the encoding parameters from the encoding parameter control unit 11 to perform the variable length encoding in a sequence according to the H.264 standard (see Non-Patent Document 1). Encoding data acquired after performing the variable length encoding are outputted to the output control unit 26.

The slice header encoding unit 25 receives the encoding parameters from the encoding parameter control unit to perform the variable length encoding in a sequence according to the H.264 standard (see Non-Patent Document 1). Encoding data acquired after performing the variable length encoding are outputted to the output control unit 26.

The PPS encoding unit 24 receives the encoding parameters from the encoding parameter control unit 11 to perform the variable length encoding. Encoding data acquired after performing the variable length encoding are outputted to the output control unit 26. Further, the PPS encoding unit 24 outputs the "entropy_coding_mode_flag" to the CAVLC encoding unit 22.

Figures 3, 4:
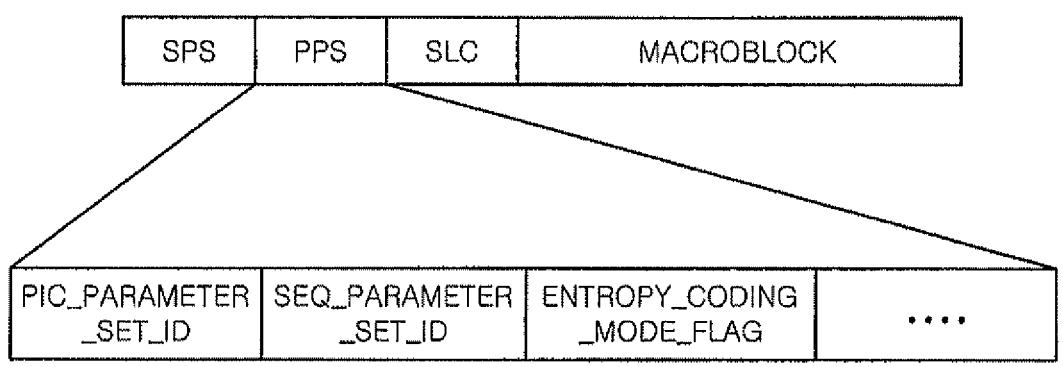
FIG. 3 is a diagram showing an "entropy_coding_mode_flag" in accordance with the embodiment of the present invention.
FIG. 4 is a diagram showing an example of a bit stream in accordance with the embodiment of the present invention.

In the present embodiment, the "entropy_coding_mode_flag" is set, as shown in FIG. 3. That is, the "entropy_coding_mode_flag" is formed of two bits and is set such that "entropy_coding_mode_flag=00" indicates that the variable length encoding method is "CAVLC", "entropy_coding_mode_flag=01" indicates that the variable length encoding method is "CABAC", "entropy_coding_mode_flag=10" indicates that the variable length encoding method is "CAVLC" in accordance with the present invention. Further, "entropy_coding_mode_flag=11" indicates that the variable length encoding method is "Reserved". Although in the present embodiment, "entropy_coding_mode_flag=11" is "Reserved", it may be set to another method. Alternatively, the CAVLC in accordance with the embodiment of the present invention may be the variable length encoding method in the case of "entropy_coding_mode_flag=11".

The output control unit 26 outputs a bit stream which is obtained by performing the variable length encoding on the quantized transform coefficients and the encoding parameters by the CABAC encoding unit 21, the CAVLC encoding unit 22, the SPS encoding unit 23, the PPS encoding unit 24, and the slice header encoding unit 25. An example of the configuration of the bit stream outputted from the output control unit 26 will be described with reference to FIG. 4. The bit stream is formed of SPS (Sequence Parameter Set), PPS (Picture Parameter Set), SLC (SLiCe header) and macroblock data.

The PPS portion includes a "pic_parameter_set_id", a "seq_parameter_set_id", an "entropy_coding_mode_flag" and the like.

Figure 5:
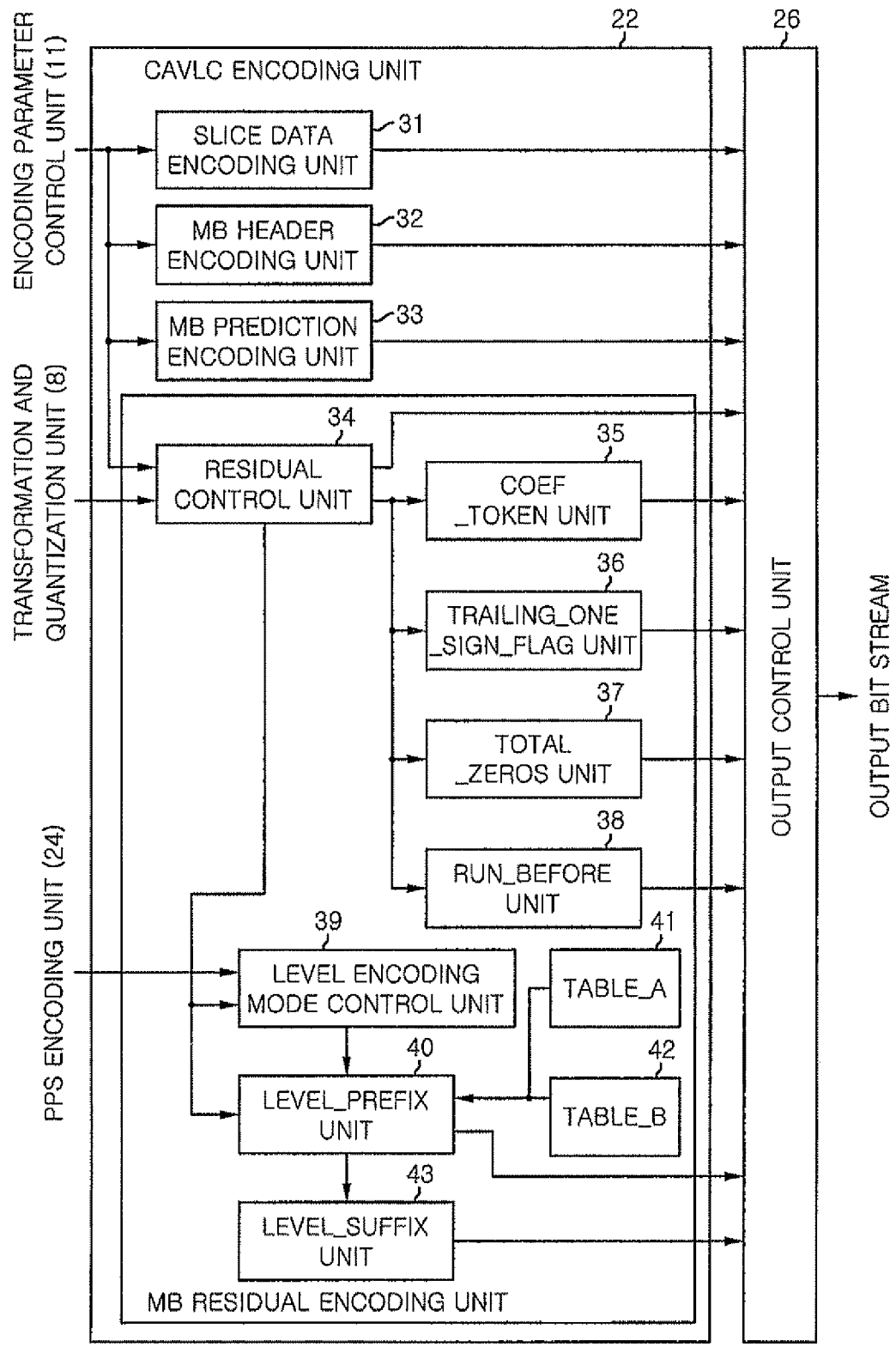
FIG. 5 is a functional block diagram of a CAVLC encoding unit in accordance with the embodiment of the present invention.

FIG. 5 is a diagram showing details of the CAVLC encoding unit 22 shown in FIG. 2. As shown in FIG. 5, the CAVLC encoding unit 22 includes a slice data encoding unit 31, an MB header encoding unit 32, an MB prediction encoding unit 33, a residual control unit 34, a coef_token unit 35, a trailing_one_sign_flag unit 36, a total_zeros unit 37, a run_before unit 38, a level encoding mode control unit 39, a level_prefix unit 40, table_A 41, table_B 42, and a level_suffix unit 43.

The slice data encoding unit 31 receives the encoding parameters from the encoding parameter control unit 11 to perform the variable length encoding in a sequence according to the H.264 standard (see Non-Patent Document 1). Encoding data acquired after performing the variable length encoding are outputted to the output control unit 26.

The MB header encoding unit 32 receives the encoding parameters from the encoding parameter control unit 11 to perform the variable length encoding in a sequence according to the H.264 standard (see Non-Patent Document 1). Encoding data acquired after performing the variable length encoding are outputted to the output control unit 26.

The MB prediction encoding unit 33 receives the encoding parameters from the encoding parameter control unit to perform the variable length encoding in a sequence according to the H.264 standard (see Non-Patent Document 1). Encoding data acquired after performing the variable length encoding are outputted to the output control unit 26.

The residual control unit 34 receives the quantized transform coefficients from the transformation and quantization unit 8 and the encoding parameters from the encoding parameter control unit 11 and outputs a coef_token parameter to the coef_token unit 35, a trailing_one_sign_flag parameter to the trailing_one_sign_flag unit 36, a total_zeros parameter to the total_zeros unit 37, a run_before parameter to the run_before unit 38, and a level parameter or the like to the level encoding mode control unit 39 and the level_prefix unit 40, based on the encoding parameters and the quantized transform coefficients.

Further, in the case where the "CAVLC" in accordance with the present invention has been chosen in the PPS encoding unit 24, i.e., in the case where "entropy_coding_mode_flag=10", the residual control unit 34 outputs "mb_level_offset_flag" determined by the level encoding mode control unit 39 based on an encoding mode in the parameters received from the encoding parameter control unit 11 and the quantized transform coefficients received from the transformation and quantization unit 8.

Figure 6:
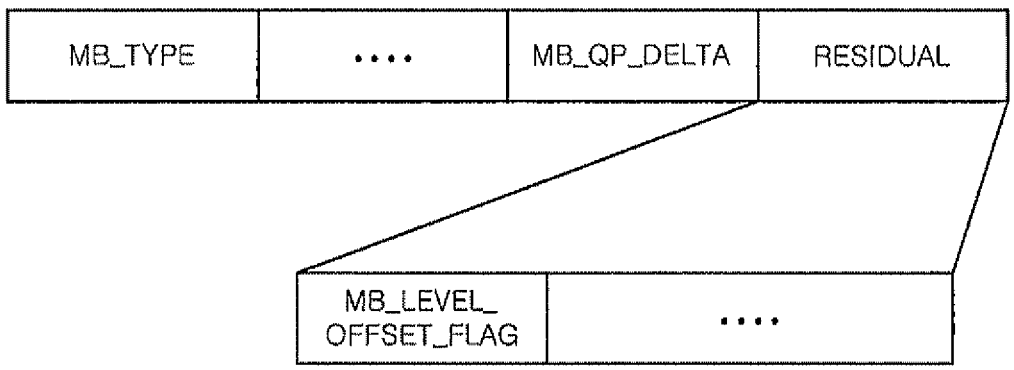
FIG. 6 is a diagram showing a storage position of "mb_level_offset_flag" in a bit stream when "mb_level_offset_flag" is outputted in accordance with the embodiment of the present invention.

FIG. 6 is a diagram showing a storage position of "mb_level_offset_flag" in a bit stream when "mb_level_offset_flag" is outputted from the residual control unit 34 shown in FIG. 5. In the bit stream, the macroblock data shown in FIG. 4 includes "mb_type", "mb_qp_delta", "residual", and the like, and "mb_level_offset_flag" is stored at a foremost portion in the "residual".

Referring back to FIG. 5, the coef_token unit 35 receives the coef_token parameter from the residual control unit 34 to perform the variable length encoding in the sequence according to the H.264 standard (see Non-Patent Document 1). Encoding data acquired after performing the variable length encoding are outputted to the output control unit 26.

The trailing_one_sign_flag unit 36 receives the trailing_one_sign_flag parameter from the residual control unit 34 to perform the variable length encoding in a sequence according to the H.264 standard (see Non-Patent Document 1). Encoding data acquired after performing the variable length encoding are outputted to the output control unit 26.

The total_zeros unit 37 receives the total_zeros parameter from the residual control unit 34 to perform the variable length encoding in a sequence according to the H.264 standard (see Non-Patent Document 1). Encoding data acquired after performing the variable length encoding are outputted to the output control unit 26.

The run_before unit 38 receives the run_before parameter from the residual control unit 34 to perform the variable length encoding in a sequence according to the H.264 standard (see Non-Patent Document 1). Encoding data acquired after performing the variable length encoding are outputted to the output control unit 26.

The level encoding mode control unit 39 receives the level parameter from the residual control unit 34, determines to choose one among a mode of table_A 41, a mode of table_B 42 and a mode of a mixture of table_A 41 and table_B 42 to perform a level_prefix encoding and outputs the result from the determination to the residual control unit 34 and the level_prefix unit 40. Alternatively, this determination may be performed by the residual control unit 34.

Figure 7:
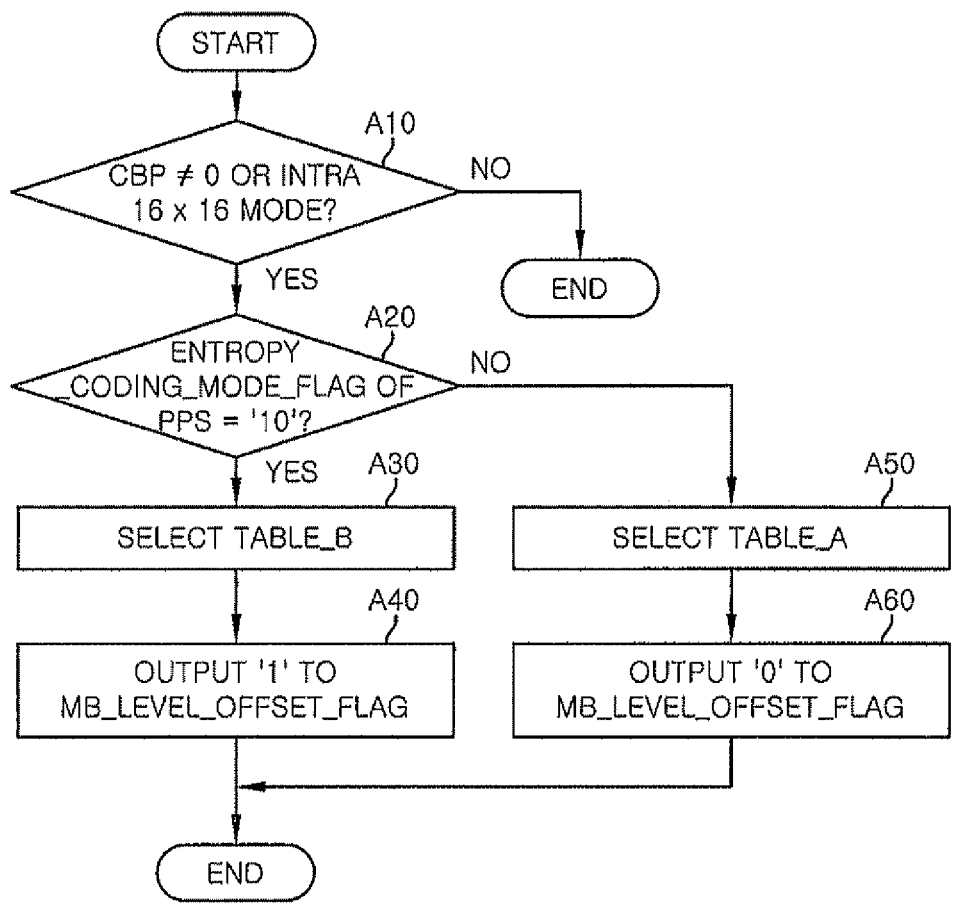
FIG. 7 is a flowchart showing an example of a process in which a level_prefix encoding mode is determined in accordance with the embodiment of the present invention.

More specifically, a sequence in which the level encoding mode control unit 39 determines an encoding mode of the level_prefix will be described with reference to FIG. 7. FIG. 7 is a flowchart showing an example of the sequence in which the encoding mode of the level_prefix is determined by the level encoding mode control unit 39 shown in FIG. 5.

First, at step A10, the level encoding mode control unit 39 receives, from the residual control unit 34, a CBP (coded block pattern) indicating whether level data other than 0 is present in a macroblock and the prediction mode of the macroblock and determines whether or not the CBP is zero or whether or not the prediction mode is an intra 16×16 mode.

If step A10 is determined not to be satisfied (N at step A10), i.e., if the CBP is 0 and also the prediction mode of the macroblock is not the intra 16×16 mode, the level encoding mode control unit 39 determines that the level encoding is not needed and completes the process. Meanwhile, if step A10 is determined to be satisfied (Y at step A10), i.e., if CBP is not 0 or the prediction mode of the macroblock is the Intra 16×16 mode, the level encoding mode control unit 39 proceeds to step A20, receives "entropy_coding_mode_flag" from the PPS encoding unit 24, and determines whether or not the "entropy_coding_mode_flag" is '10'. If step A20 is determined to be satisfied (Y at step A20), i.e., the "entropy_coding_mode_flag" is '10', the level encoding mode control unit 39 proceeds to step A30, and selects table_B 42. Then, process proceeds to step A40, in which the level encoding mode control unit 39 sets "mb_level_offset_flag" to '1' and completes the process.

Meanwhile, if step A20 is determined not to be satisfied (N at step A20), i.e., if "entropy_coding_mode_flag" is not '10', the level encoding mode control unit 39 proceeds to step A50 and selects table_A 41. Then, the process proceeds to step A60, and the level encoding mode control unit 39 sets "mb_level_offset_flag" to '0' and completes the process.

Referring to FIG. 8 and FIG. 9, table_A 41 and table_B 42 shown in FIG. 5 will now be described.

FIG. 8 shows an example of table_A 41. This table is the same as that in H.264 standard (see Non-Patent Document 1). That is, zeros the number of which is equal to the number of bits corresponding to the value of the level_prefix are placed in front of '1'.

FIG. 9 shows an example of table_B 42. In this table, when the level_prefix is in the range from '0' to '3', zeros the number of which is equal to the number of bits corresponding to a value obtained by adding '1' to the value of the level_prefix are placed in front of a '1'. Further, when the level_prefix is equal to or larger than '4', '1' is placed in the first digit place of bits, and a value obtained by subtracting '4' from the level_prefix value is placed in a form of a fixed_length of four bits. Further, since the number of '0's presented in the bit string of the level_prefix is conventionally up to 16, a maximum of 19 level_prefixes can be presented by using the above-described placement. Furthermore, the level_prefix is processed in a mode of the value ranging from '0' to '3' or in a mode of the value being larger than '4', which can be distinctively selected depending on the first bit of level_prefix. When the table_B 42 is used, the level_prefix can be presented using a small amount of bits in a case where the level_prefix is '5' or larger, compared to table_A 41, so that the amount of code bits becomes smaller, thereby increasing compression efficiency.

Further, the threshold value of the level_prefix on which fixed-length encoding is performed may be other than '4', or may be adaptive. In the adaptive way, the threshold value may be indicated using an index in the header of a macroblock, or the threshold value may be indicated by using the number of coefficients of a target macroblock, other than '0'. Furthermore, the conventional variable length encoding may be performed using table_A 41.

Referring back to FIG. 5, the level_prefix unit 40 receives a level parameter or the like from the residual control unit 34 and the encoding mode of level_prefix from the level encoding mode control unit 39 to perform the encoding of the level_prefix and generation of level_suffix parameter by using the table_A 41 and/or the table_B 42. Encoding data from the level_prefix encoding is outputted to the output control unit 26, and the level_suffix parameter is outputted to the level_suffix unit 43.

The level_suffix unit 43 receives the level_suffix parameter from the level_prefix unit 40 to perform the variable length encoding in the sequence according to the H.264 standard (see Non-Patent Document 1). Encoding data acquired after performing the variable length encoding are outputted to the output control unit 26.

As described above, in the encoding of video image data in accordance with the present embodiment, when levels have been converted as a plurality of elements, at least one code table is defined in two types to be chosen, one of which is suitable for a case where the elements have low values and the other of which is suitable for a case where the elements have high values, so that the amount of code bits attributable to levels within a generated bit stream is reduced, thereby improving compression rate when a video image is encoded.

Figure 10:
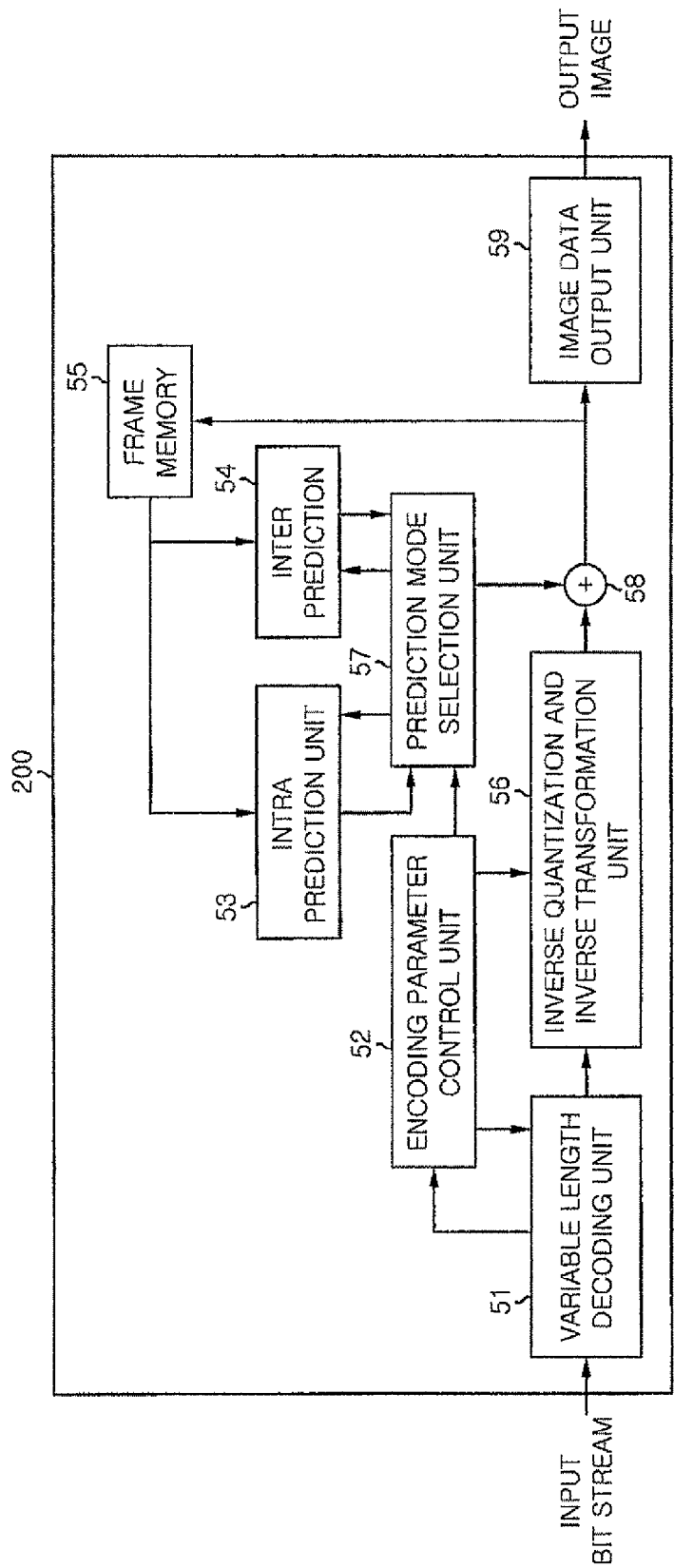
FIG. 10 is a functional block diagram of a video image decoding device in accordance with the embodiment of the present invention.

Next, a method of decoding video image data encoded by the above-described process will be described. FIG. 10 is a functional block diagram showing an example of the overall configuration of a video image decoding device 200 for decoding video image data encoded by the video encoding device 100 in accordance with the embodiment of the present invention.

As shown in FIG. 10, the video image decoding device 200 includes a variable length decoding unit 51, an encoding parameter control unit 52, an intra prediction unit 53, an inter prediction unit 54, frame memory 55, an inverse quantization and inverse transformation unit 56, a prediction mode selection unit 57, an adder 58 and an image data output unit 59.

A variable length decoding is first performed on a bit stream, which is outputted from the video image encoding device 100, by the variable length decoding unit 51, and information on pixels and encoding parameter information is generated during the variable length decoding. An inverse quantization and an inverse transformation are performed on the information on pixels, which has been generated by the corresponding variable length decoding, by the inverse quantization and inverse transformation unit 56, and the result thereof is outputted to the adder 58. The information outputted from the inverse quantization and inverse transformation unit 56 is referred to as a "reconstructed differential image".

Meanwhile, the encoding parameter information generated by the variable length decoding performed by the variable length decoding unit 51 is outputted to the encoding parameter control unit 52, and the prediction mode included in the encoding parameter information is outputted to the prediction mode selection unit 57 from the encoding parameter control unit 52.

The prediction mode selection unit 57 selects an intra prediction mode or an inter prediction mode based on the prediction mode obtained from the encoding parameter control unit 52, receives a predicted image from the intra prediction unit 53 in the case of intra prediction mode or from inter prediction unit 54 in the case of inter prediction mode and outputs the received predicted image to the adder 58.

The intra prediction unit 53, when the intra prediction mode is received from the prediction mode selection unit 57, creates an intra predicted image based on the reference image data obtained from the frame memory 55 and outputs the intra predicted image to the prediction mode selection unit 57.

The inter prediction unit 54, when the inter prediction mode is received from the prediction mode selection unit 57, creates an inter predicted image based on the reference image data obtained from the frame memory 55 and outputs the inter predicted image to the prediction mode selection unit 57.

The adder 58 reconstructs data approximating the original video image data (hereinafter referred to as "reconstructed image data") by adding the reconstructed differential image outputted from the inverse quantization and inverse transformation unit 56 and the predicted image outputted from the prediction mode selection unit 57.

The reconstructed image data are outputted from the video image decoding device 200 to the exterior via the image data output unit 59 and, at the same time, are stored in the frame memory 55, which stores the reference image data, to be used in following video image decoding.

Figure 11:
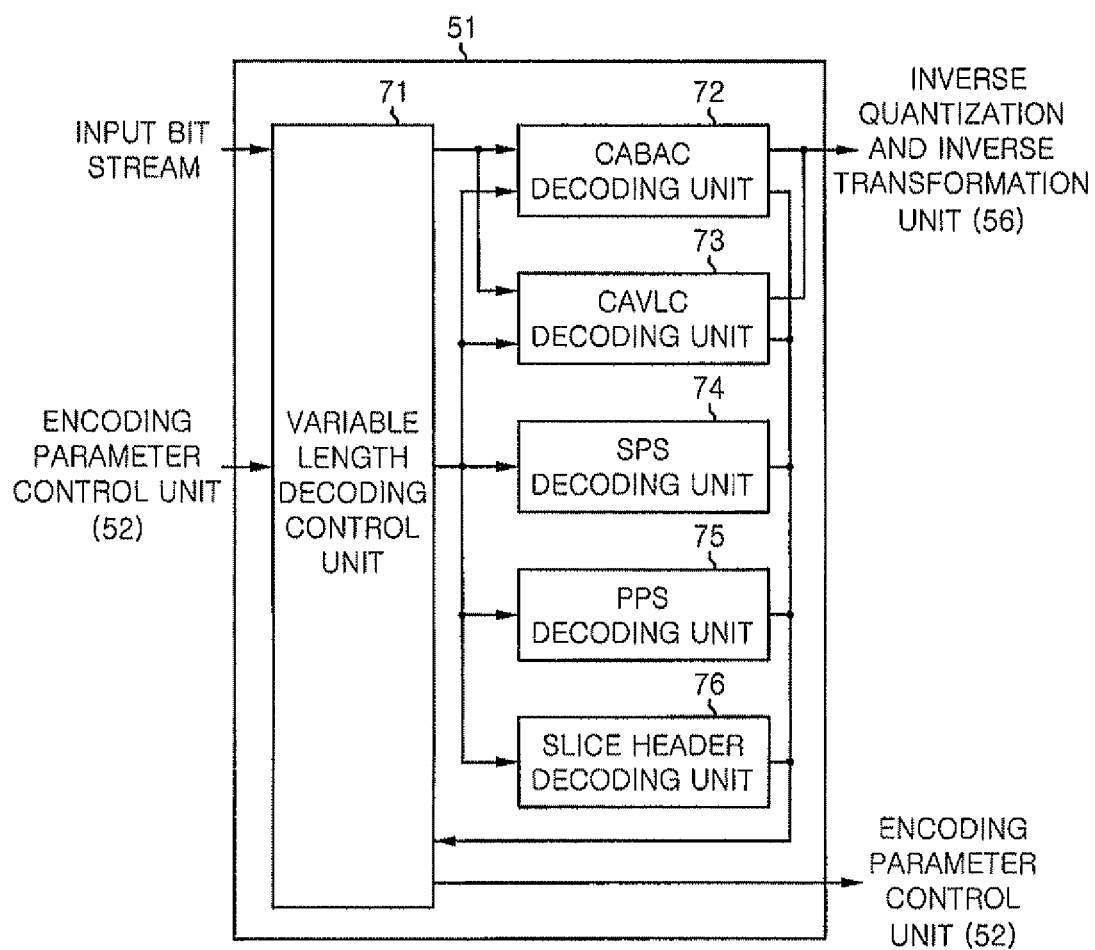
FIG. 11 is a functional block diagram of a variable length decoding unit in accordance with the embodiment of the present invention.

FIG. 11 is a diagram showing details of the variable length decoding unit 51 shown in FIG. 10. As shown in FIG. 11, the variable length decoding unit 51 includes a variable length decoding control unit 71, a CABAC decoding unit 72, a CAVLC decoding unit 73, an SPS decoding unit 74, a PPS decoding unit 75 and a slice header decoding unit 76.

The variable length decoding control unit 71 controls the variable length decoding based on an inputted bit stream and the encoding parameters outputted from the encoding parameter control unit 52. More specifically, the variable length decoding control unit 71 executes: a control of processing sequence of the CABAC decoding unit 72, the CAVLC decoding unit 73, the SPS decoding unit 74, the PPS decoding unit 75 and the slice header decoding unit 76; a control of bit stream outputted to the CABAC decoding unit 72, the CAVLC decoding unit 73, the SPS decoding unit 74, the PPS decoding unit 75 and the slice header decoding unit 76; management of encoding status and encoding parameters which are fed back from the CABAC decoding unit 72, the CAVLC decoding unit 73, the SPS decoding unit 74, the PPS decoding unit 75 and the slice header decoding unit 76; and an output of the encoding parameters to the encoding parameter control unit 52.

The CABAC decoding unit 72 receives the bit stream and the encoding parameters from the variable length decoding control unit 71 to perform the variable length decoding in a sequence according to the H.264 standard (see Non-Patent Document 1). Decoding data acquired after performing the variable length decoding is outputted to the inverse quantization and inverse transformation unit 56. The encoding parameters, such as the prediction mode, the motion vector or the like, and the amount of bits used in decoding are outputted to the variable length decoding control unit 71.

The CAVLC decoding unit 73 receives the bit stream and the encoding parameters from the variable length decoding control unit 71 to perform the variable length decoding in a sequence which will be described in detail later. Decoding data acquired after performing the variable length decoding is outputted to the inverse quantization and inverse transformation unit 56. The encoding parameters, such as the prediction mode, the motion vector or the like, and the amount of bits used in the decoding are outputted to the variable length decoding control unit 71.

The SPS decoding unit 74 receives the bit stream and the encoding parameters from the variable length decoding control unit 71 to perform the variable length decoding in a sequence according to the H.264 standard (see Non-Patent Document 1). Encoding parameters and the amount of bits used in the decoding are outputted to the variable length decoding control unit 71.

The slice header decoding unit 76 receives the bit stream and the encoding parameters from the variable length decoding control unit 71 to perform variable length decoding in the sequence according to the H.264 standard (see Non-Patent Document 1). Encoding parameters and a the amount of bits used in the decoding are outputted to the variable length decoding control unit 71.

The PPS decoding unit 75 receives the bit stream and the encoding parameters from the variable length decoding control unit 71 and outputs encoding parameters and the amount of bits used in the decoding to the variable length decoding control unit 71. The "entropy_coding_mode_flag" in the encoding parameters is the same as described by referring to FIGS. 3 and 4.

Figure 12:
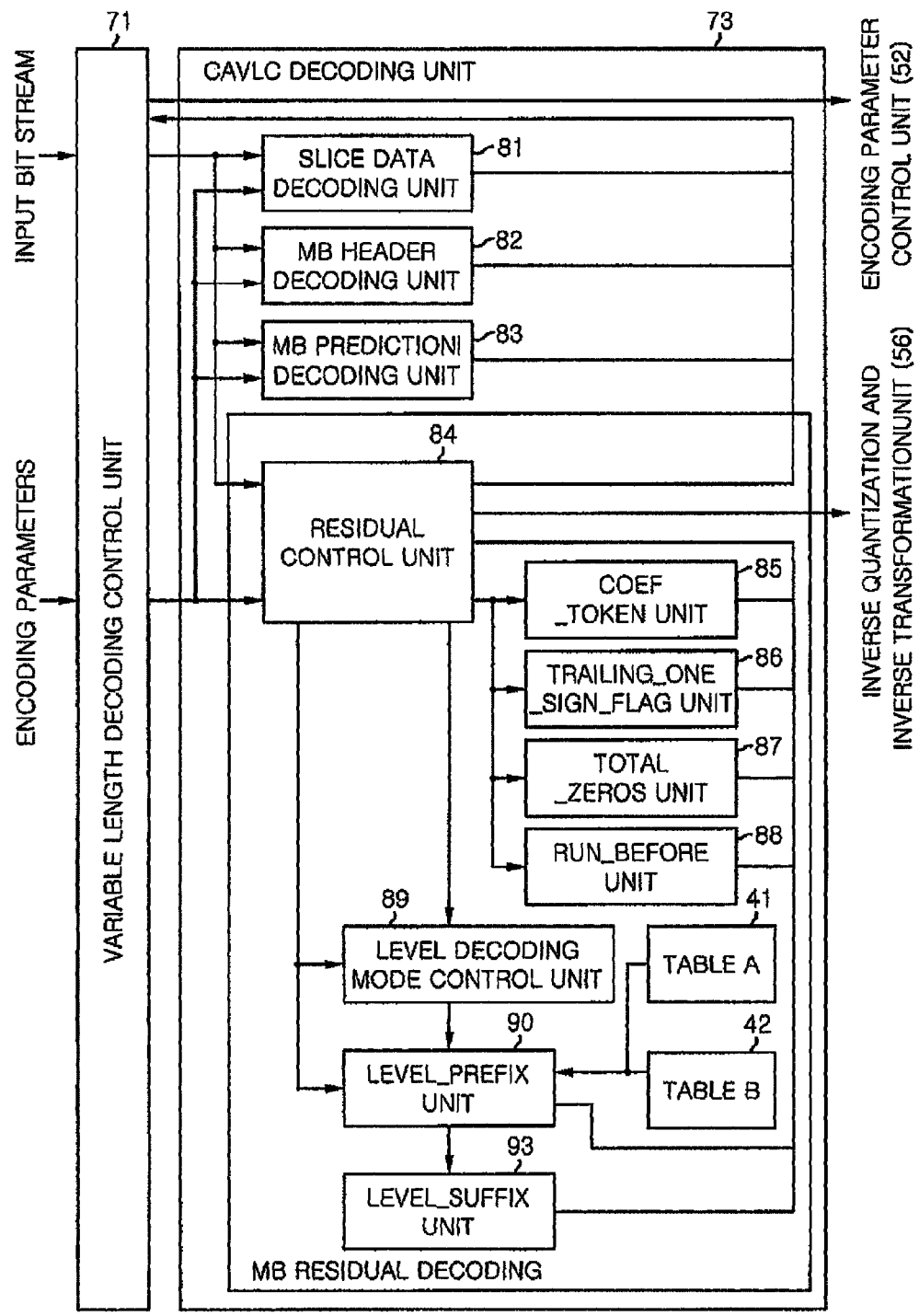
FIG. 12 is a functional block diagram of a CAVLC decoding unit in accordance with the embodiment of the present invention.

FIG. 12 is a diagram showing the details of the CAVLC decoding unit 73 shown in FIG. 11. As shown in FIG. 12, the CAVLC decoding unit 73 includes a slice data decoding unit 81, an MB header decoding unit 82, an MB prediction decoding unit 83, a residual control unit 84, a coef_token unit 85, a trailing_one_sign_flag unit 86, a total_zeros unit 87, a run_before unit 88, a level decoding mode control unit 89, a level_prefix unit 90, table_A 41, table_B 42, and a level_suffix unit 93.

The slice data decoding unit 81 receives the encoding parameters and the input bit stream from the variable length decoding control unit 71 to perform the variable length decoding in a sequence according to the H.264 standard (see Non-Patent Document 1). Encoding parameters obtained after performing the variable length decoding are outputted to the variable length decoding control unit 71.

The MB header decoding unit 82 receives the encoding parameters and the input bit stream from the variable length decoding control unit 71 to perform the variable length decoding in a sequence according to the H.264 standard (see Non-Patent Document 1). Encoding parameters obtained after performing the variable length decoding are outputted to the variable length decoding control unit 71.

The MB prediction decoding unit 83 receives the encoding parameters and the input bit stream from the variable length decoding control unit 71 to perform the variable length decoding in a sequence according to the H.264 standard (see Non-Patent Document 1). Encoding parameters obtained after performing the variable length decoding are outputted to the variable length decoding control unit 71.

The residual control unit 84 receives the encoding parameters and the input bit stream from the variable length decoding control unit 71 and controls the variable length decoding in a residual part based on the input bit stream and the encoding parameters.

More specifically, the residual control unit 84 executes: a control of processing sequence of the coef_token unit 85, the trailing_one_sign_flag unit 86, the total_zeros unit 87, the run_before unit 88, the level decoding mode control unit 89 and the level_prefix unit 90; a control of the bit stream outputted to the coef_token unit 85, the trailing_one_sign_flag unit 86, the total_zeros unit 87, the run_before unit 88, the level decoding mode control unit 89 and the level_prefix unit 90; management of decoding status and encoding parameters fed back from the coef_token unit 85, the trailing_one_sign_flag unit 86, the total_zeros unit 87, the run_before unit 88, the level_prefix unit 90, and the level_suffix unit 93; and an output to the variable length decoding control unit 71.

The decoding data obtained by the residual control unit 84 is outputted to the inverse quantization and inverse transformation unit 56.

Further, in particular, the residual control unit 84 performs the decoding of the "mb_level_offset_flag" based on the "entropy_coding_mode_flag" decoded by the PPS decoding unit 75 included in the encoding parameters received from variable length decoding control unit 71.

The coef_token unit 85 receives a bit stream from the residual control unit 84 to perform the variable length decoding in the sequence according to the H.264 standard (see Non-Patent Document 1). Encoding parameter information is outputted to the residual control unit 84.

The trailing_one_sign_flag unit 86 receives the bit stream from the residual control unit 84 to perform the variable length decoding in a sequence according to the H.264 standard (see Non-Patent Document 1). Encoding parameter information is outputted to the residual control unit 84.

The total_zeros unit 87 receives the bit stream from the residual control unit 84 to perform the variable length decoding in a sequence according to the H.264 standard (see Non-Patent Document 1). Encoding parameter information is outputted to the residual control unit 84.

The run_before unit 88 receives the bit stream from the residual control unit 84 to perform the variable length decoding in a sequence according to the H.264 standard (see Non-Patent Document 1). Encoding parameter information is outputted to the residual control unit 84.

The level decoding mode control unit 89 receives the encoding parameters, such as the "mb_level_offset_flag", "coef_token" or the like from the residual control unit 84, determines to choose one among a mode of table_A 41, a mode of table_B 42 and a mode of a mixture of table_A 41 and table_B 42 to perform level_prefix decoding and outputs the results of the determination to the level_prefix unit 90.

The level_prefix unit 90 receives the level parameter and the like from the residual control unit 84 and the mode for decoding of the level_prefix decoding from the level decoding mode control unit 89 to perform the decoding of the level_prefix and the generation of the level_suffix decoding parameter by using table_A 41 and/or table_B 42. An obtained level_prefix value is outputted to the residual control unit 84, and the level_suffix decoding parameter is outputted to the level_suffix unit 93.

The level_suffix unit 93 receives the level_suffix parameter from the level_prefix unit 90 to perform the variable length decoding in a sequence according to the H.264 standard (see Non-Patent Document 1). An obtained level_suffix value is outputted to the residual control unit 84.

As described above, in the video image decoding device 200, decoding may be performed on the video image data encoded by the video image encoding device 100.

Further, although the video encoding device 100 outputs the bit stream including the "pic_parameter_set_id," the "seq_parameter_set_id" and the "entropy_coding_mode_flag" in the PPS portion from the output control unit 26 (see FIG. 4), it may output a bit stream including "level_code_offset_idx" in the PPS portion.

By referring to FIGS. 13 and 14, an example of a bit stream including the "level_code_offset_idx" in the PPS portion will be described.

Figures 13, 14:
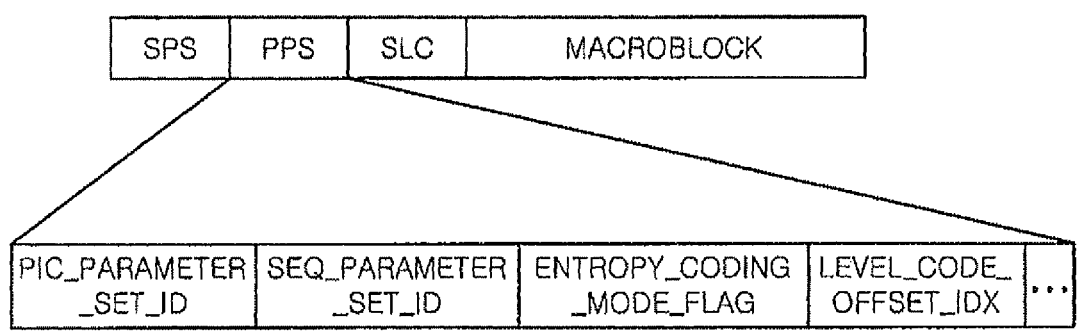
FIG. 13 is a diagram showing an example of another bit stream in accordance with the embodiment of the present invention.
FIG. 14 shows an example of a "level_code_offset_idx" included in the bit stream shown in FIG. 13 in accordance with the embodiment of the present invention.

FIG. 13 is a diagram showing the bit stream including the "level_code_offset_idx" in the PPS portion. This bit stream includes a SPS, a PPS, an SLC, a macroblock data and the like. The PPS portion includes the "pic_parameter_set_id," the "seq_parameter_set_id," the "entropy_coding_mode_flag," and the "level_code_offset_idx".

In the bit stream, the "entropy_coding_mode_flag" is set, as described by referring to FIG. 3. That is, the "entropy_coding_mode_flag" is formed of two bits, and is set such that "entropy_coding_mode_flag=00" indicates that the variable length encoding method is "CAVLC", "entropy_coding_mode_flag=01" indicates that the variable length encoding method is "CABAC", and "entropy_coding_mode_flag=10" indicates that the variable length encoding method is "CAVLC" in accordance with the present invention.

Referring to FIG. 14, an example of the "level_code_offset_idx" included in the PPS portion will be described. The "level_code_offset_idx" is a portion where when the bit string of the level_prefix in table_B 42 of FIG. 9 is determined, the level_prefix (referred to as "value level_code_offset") presented by '1' and its following bits of fixed length are stored.

Here, the variable length encoding is performed on the value obtained by subtracting 4 from the level_code_offset by using exponential Golomb codes, and the resulting value is stored in the "level_code_offset_idx". Further, another method of the variable length encoding may be used for the level_code_offset_idx, and the storing may be performed by using a bit string of fixed length.

Further, although FIG. 7 shows the sequence for determining the encoding mode of the level_prefix by the level encoding mode control unit 39 in the video image encoding device 100 in which the table_B 42 is selected when the "entropy_coding_mode_flag" is '10', a process of determining whether a value of the "total_coeff" indicative of the number of non-zero coefficients is equal to or larger than a predetermined threshold value may be further provided.

Figure 15:
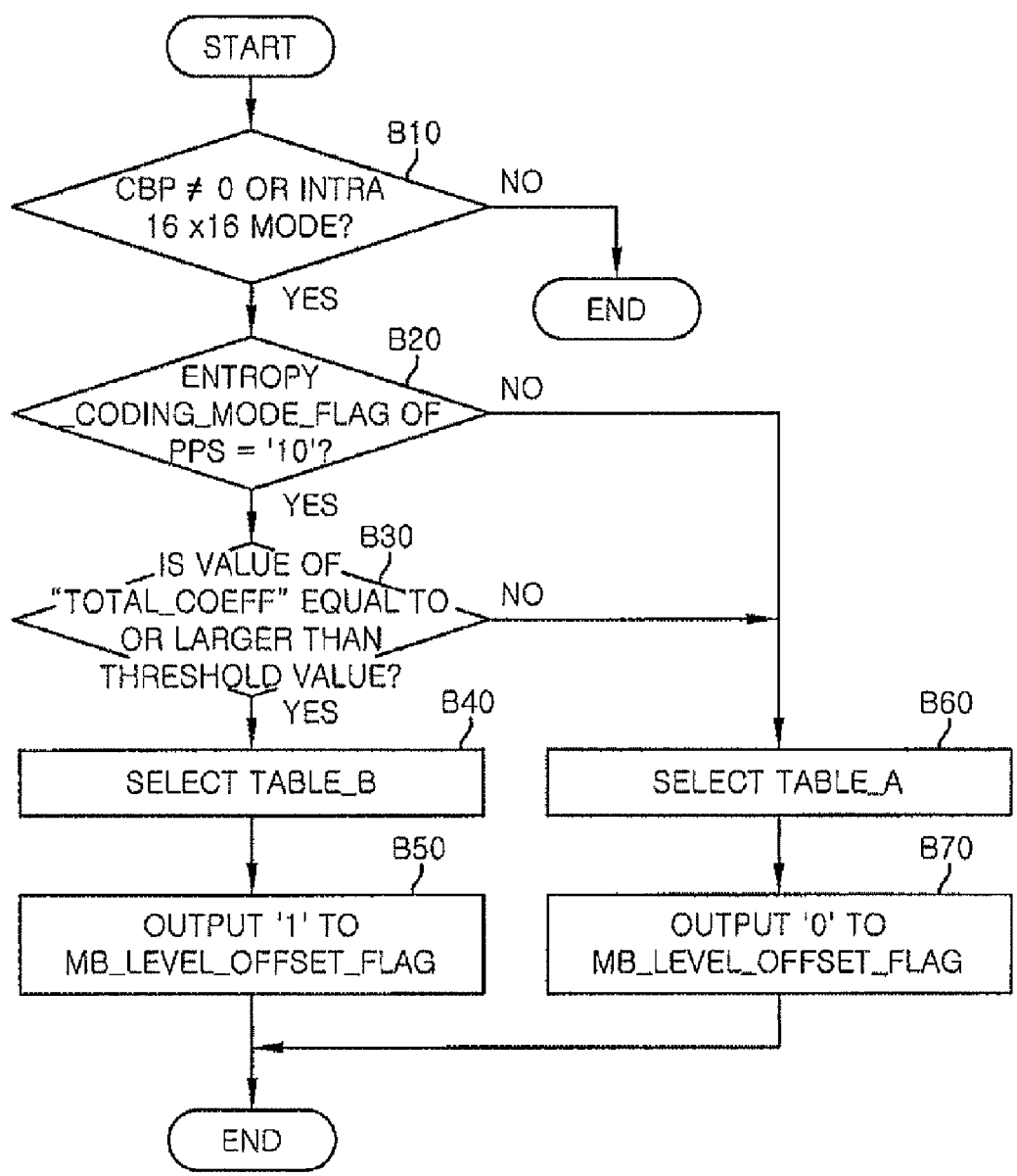
FIG. 15 is a flowchart showing an example of another process in which level_prefix decoding mode is determined in accordance with the embodiment of the present invention.

More specifically, the sequence in which the level_prefix encoding mode is determined will be described with reference to FIG. 15. FIG. 15 is a flowchart showing another example of the sequence in which the encoding mode of the level_prefix is determined by the level encoding mode control unit 39 shown in FIG. 5. Further, the determination of the encoding mode may be performed by the residual control unit 34.

First, at step B10, the level encoding mode control unit 39 receives, from the residual control unit 34, a CBP indicative of whether or not level data in a macroblock is other than 0, and the prediction mode of the macroblock and determines whether or not the CBP is not 0 or whether or not the prediction mode is an intra 16×16 mode.

If step B10 is determined not to be satisfied (N at step B10), the level encoding mode control unit 39 determines that the level encoding is not needed and completes the process. Meanwhile, if step B10 is determined to be satisfied (Y at step B10), the level encoding mode control unit 39 proceeds to step B20 to receive the "entropy_coding_mode_flag" from the PPS encoding unit 24, and determine whether or not the "entropy_coding_mode_flag" is '10'. If step B20 is determined not to be satisfied (N at step B20), the level encoding mode control unit 39 proceeds to step B60 to select the table_A 41. Further, the level encoding mode control unit 39 proceeds to step B70, and sets the "mb_level_offset_flag" to '0'.

Meanwhile, if Y at step B20, that is, the "entropy_coding_mode_flag" is '10,' the level encoding mode control unit 39 proceeds to step B30 to receive the value of the "total_coeff" from the residual control unit 34 and determine whether or not the value of "total_coeff" is equal to or higher than a preset threshold value. If Y at step B30, the level encoding mode control unit 39 proceeds to step B40 to select the table_B 42. Further, the level encoding mode control unit 39 proceeds to step B50, and sets the "mb_level_offset_flag" to '1', and then, process is completed. Meanwhile, if N at step B30, i.e., the value of the "total_coeff" is lower than the preset threshold value, the level encoding mode control unit 39 proceeds to step B60 to select the table_A 41 and set the "mb_level_offset_flag" to '0' at step B70, and then, the process is completed.

Further, when selecting table_B 42 at step B40, the level encoding mode control unit 39 may use whether or not the "total_zeros" is equal to or lower than a predetermined threshold value and/or whether the "suffixLength" is equal to or lower than a predetermined threshold value, other than whether the value is equal to or higher than the preset threshold value. These conditions may be used separately or in combination.

The present embodiment is briefly described as follows. The video image encoding device in accordance with the present embodiment includes a variable length encoding unit for performing the variable length encoding on quantized transform coefficients which have been orthogonally transformed and quantized with respect to each small region of video image data. The variable length encoding unit has a plurality of encoding modes for performing the variable length encoding on the quantized transform coefficients and performs the variable length encoding by one of the encoding modes. One of the encoding modes is used to perform the fixed length encoding on a level_prefix which forms a level of the coefficients.

Further, the variable length encoding unit may output a bit stream storing therein the encoding mode used in the variable length encoding.

Furthermore, the variable length encoding unit may store the encoding mode in a portion where information acting on the unit of a plurality of pictures is stored.

Furthermore, the variable length encoding unit may make a first bit of an encoded level equal to or higher than a predetermined threshold value to differ from a first bit of an encoded level lower than the predetermined threshold value.

Furthermore, the variable length encoding unit may set the amount of bits to a fixed length which is obtained by adding a predetermined value to the level.

Furthermore, the variable length encoding unit may vary the predetermined threshold value for each small region.

While the invention has been shown and described with respect to the embodiments, the present invention is not limited thereto. It will be understood by those skilled in the art that various changes and modifications may be made.

Industrial Applicability

The present invention can be applied to a method of encoding and decoding video image at high bit rate, in particular, to an image encoding device or an image processing device including an image encoding device.

What is claimed is:

1. A video image encoding device comprising:
a transformation and quantization unit generating quantized transform coefficients which have been subjected to orthogonal transformation and quantization with respect to video image data on a region basis,
a variable length encoding unit performing variable length encoding on the quantized transform coefficients,
wherein the variable length encoding unit has a plurality of encoding modes including a modified CAVLC (Context Adaptive Variable Length Coding) mode to perform modified CAVLC encoding on each level of the quantized transform coefficients, a level_prefix of each level being encoded into one of variable-length codes and fixed-length codes,
wherein, in the modified CAVLC mode, the variable length encoding unit encodes a level_prefix equal to or greater than a threshold value into one of the fixed-length codes which are distinguishable from each other,
wherein, in the modified CAVLC mode, a level_prefix smaller than the threshold value is encoded into one of the variable-length codes, and
wherein each of the variable-length codes of the level_prefixes has a bit string formed by placing, in front of '1', one or more '0's the number of which is obtained by adding 1 to a value of the corresponding level_prefix, and each of the fixed-length codes of the level_prefixes consists of a bit string starting with '1' and having a fixed length.

2. The video image encoding device of claim 1, wherein a flag indicating one of the encoding modes is included in a PPS (Picture Parameter Set) field of an output bit stream from the variable length encoding unit.

3. The video image encoding device of claim 1, wherein the variable length encoding unit performs the modified CAVLC encoding by using a first table including the fixed-length codes and the variable-length codes when a first condition that a CBP (Coded Block Pattern) is not zero or a prediction mode is an Intra 16×16 mode and a second condition that an entropy_coding_mode_flag in a PPS (Picture Parameter Set) field has a specific value are met, and
wherein the variable length encoding unit performs encoding in a CAVLC mode by using a second table consisting of another set of variable-length codes when the first condition is met and the second condition is not met.

4. The video image encoding device of claim 1, wherein the variable length encoding unit performs the modified CAVLC encoding by using a first table including the fixed-length codes and the variable-length codes when a first condition that a CBP (Coded Block Pattern) is not zero or a prediction mode is an Intra 16×16 mode and a second condition that an entropy_coding_mode_flag in a PPS (Picture Parameter Set) field has a specific value and a third condition that a value of a total_coeff indicative of the number of non-zero quantized transform coefficients is equal to or greater than an another threshold value are met, and
wherein the variable length encoding unit performs encoding in a CAVLC mode by using a second table consisting of another set of variable-length codes when the first condition is met and at least one of the second and the third condition is not met.

5. The video image encoding device of claim 2, wherein the variable length encoding unit performs the modified CAVLC encoding by using a first table including the fixed-length codes and the variable-length codes when a first condition that a CBP (Coded Block Pattern) is not zero or a prediction mode is an Intra 16×16 mode and a second condition that an entropy_coding_mode_flag in the PPS field has a specific value are met, and
wherein the variable length encoding unit performs encoding in a CAVLC mode by using a second table consisting of another set of variable-length codes when the first condition is met and the second condition is not met.

6. The video image encoding device of claim 2, wherein the variable length encoding unit performs the modified CAVLC encoding by using a first table including the fixed-length codes and the variable-length codes when a first condition that a CBP (Coded Block Pattern) is not zero or a prediction mode is an Intra 16×16 mode and a second condition that an entropy_coding_mode_flag in the PPS field has a specific value and a third condition that a value of a total_coeff indicative of the number of non-zero quantized transform coefficients is equal to or greater than an another threshold value are met, and
wherein the variable length encoding unit performs encoding in a CAVLC mode by using a second table consisting of another set of variable-length codes when the first condition is met and at least one of the second and the third condition is not met.

7. A video image encoding device comprising:
a transformation and quantization unit generating quantized transform coefficients which have been subjected to orthogonal transformation and quantization with respect to video image data on a region basis,
a variable length encoding unit performing variable length encoding on the quantized transform coefficients,
wherein the variable length encoding unit has a plurality of encoding modes including a modified CAVLC (Context Adaptive Variable Length Coding) mode to perform modified CAVLC encoding on each level of the quantized transform coefficients, a level_prefix of each level being encoded into one of variable-length codes and fixed-length codes,
wherein, in the modified CAVLC mode, the variable length encoding unit encodes a level_prefix equal to or greater than a threshold value into one of the fixed-length codes which are distinguishable from each other,
wherein the variable length encoding unit performs the modified CAVLC encoding by using a first table including the fixed-length codes and the variable-length codes when a first condition that a CBP (Coded Block Pattern) is not zero or a prediction mode is an Intra 16×16 mode and a second condition that an entropy_coding_mode_flag in a PPS (Picture Parameter Set) field has a specific value are met,
wherein the variable length encoding unit performs encoding in a CAVLC mode by using a second table consisting of another set of variable-length codes when the first condition is met and the second condition is not met, and
wherein, a flag indicating whether the modified CAVLC mode or the CAVLC mode is employed in the variable length encoding is included in a foremost portion in a residual field of an output bit stream from the variable length encoding unit.

8. A video image encoding device comprising:
a transformation and quantization unit generating quantized transform coefficients which have been subjected to orthogonal transformation and quantization with respect to video image data on a region basis, a variable length encoding unit performing variable length encoding on the quantized transform coefficients, wherein the variable length encoding unit has a plurality of encoding modes including a modified CAVLC (Context Adaptive Variable Length Coding) mode to perform modified CAVLC encoding on each level of the quantized transform coefficients, a level_prefix of each level being encoded into one of variable-length codes and fixed-length codes, wherein, in the modified CAVLC mode, the variable length encoding unit encodes a level_prefix equal to or greater than a threshold value into one of the fixed-length codes which are distinguishable from each other, and wherein the variable length encoding unit comprises:

a residual control unit configured to receive the quantized transform coefficients from the transformation and quantization unit and output a coef_token parameter, a trailing_one_sign_flag parameter, a total_zeros parameter, a run_before parameter, and a level parameter based on encoding parameters;

a level encoding mode control unit configured to receive the level parameter from the residual control unit, receive an entropy_coding_mode_flag representing one of the encoding modes, select an encoding mode to be used, and output the selected encoding mode;

a level_prefix unit configured to receive the level parameter from the residual control unit, perform encoding of level_prefixes by using a first table for the modified CAVLC mode and a second table for a CAVLC mode, and perform generation of level_suffix parameter; and a level_suffix unit configured to receive the level_suffix parameter from the level_prefix unit and encode level_suffixes, wherein the level encoding mode control unit selects the modified CAVLC mode when the entropy_codin_mod_flag represents the modified CAVLC mode, a prediction mode is an Intra 16×16 mode, and a value of a total_coeff indicative of the number of non-zero quantized transform coefficients is equal to or greater than an another threshold value which excludes zero.

* * * * *